(12) United States Patent
Ito

(10) Patent No.: US 10,645,757 B2
(45) Date of Patent: May 5, 2020

(54) LIGHT-IRRADIATION THERMAL TREATMENT APPARATUS

(71) Applicant: SCREEN HOLDINGS CO., LTD., Kyoto-shi, Kyoto (JP)

(72) Inventor: Yoshio Ito, Kyoto (JP)

(73) Assignee: SCREEN HOLDINGS CO., LTD., Kyoto (JP)

(*) Notice: Subject to any disclaimer, the term of this patent is extended or adjusted under 35 U.S.C. 154(b) by 307 days.

(21) Appl. No.: 15/703,316

(22) Filed: Sep. 13, 2017

(65) Prior Publication Data

US 2018/0077754 A1   Mar. 15, 2018

(30) Foreign Application Priority Data

Sep. 14, 2016   (JP) ................. 2016-179189

(51) Int. Cl.
*H05B 3/00* (2006.01)
*H01L 21/687* (2006.01)
(Continued)

(52) U.S. Cl.
CPC .......... *H05B 3/0047* (2013.01); *G01J 5/0007* (2013.01); *G01J 5/0865* (2013.01); *G01J 5/602* (2013.01); *H01L 21/67115* (2013.01); *H01L 21/67248* (2013.01); *H01L 21/68707* (2013.01); *H05B 1/0233* (2013.01); *H05B 3/009* (2013.01);
(Continued)

(58) Field of Classification Search
None
See application file for complete search history.

(56) References Cited

U.S. PATENT DOCUMENTS 4,890,245 A    12/1989   Yomoto et al.
5,707,500 A *   1/1998   Shimamura ........... C23C 14/541
                                                    118/666
(Continued)

FOREIGN PATENT DOCUMENTS

JP    2010-225613 A   10/2010

OTHER PUBLICATIONS

Taiwanese Office Action issued in corresponding Taiwanese Patent Application No. 106118183, dated Jun. 29, 2018, with partial English Translation.

*Primary Examiner* — Thor S Campbell
(74) *Attorney, Agent, or Firm* — McDermott Will & Emery LLP

(57) ABSTRACT

An atmosphere of ammonia that absorbs infrared light in a wavelength band overlapping with the measurement wavelength band of a radiation thermometer is formed in a chamber in which a semiconductor wafer is thermally treated. A filter that selectively transmits infrared light having a wavelength not overlapping with the absorption wavelength band of ammonia is installed between an optical lens system and a detector of the radiation thermometer to avoid influence of the infrared light absorption by ammonia. A conversion table corresponding to the installed filter is selected from a plurality of conversion tables representing a correlation between energy of infrared light incident on the radiation thermometer and temperature of a black body, and is used at the radiation thermometer. Accordingly, the temperature of the semiconductor wafer can be accurately measured in the atmosphere of ammonia.

2 Claims, 10 Drawing Sheets

(51) Int. Cl.
*G01J 5/60* (2006.01)
*G01J 5/08* (2006.01)
*G01J 5/00* (2006.01)
*H01L 21/67* (2006.01)
*H05B 1/02* (2006.01)
*G01J 5/04* (2006.01)

(52) U.S. Cl.
CPC ....... *G01J 5/041* (2013.01); *G01J 2005/0055* (2013.01); *G01J 2005/604* (2013.01)

(56) References Cited

U.S. PATENT DOCUMENTS

| | | | | |
|---|---|---|---|---|
| 5,968,587 | A * | 10/1999 | Frankel | C23C 16/4404 219/390 |
| 6,035,101 | A * | 3/2000 | Sajoto | C23C 16/4586 118/728 |
| 6,616,767 | B2 * | 9/2003 | Zhao | C23C 16/45565 118/725 |
| 2003/0179808 | A1 * | 9/2003 | Kim | A61B 5/01 374/122 |
| 2005/0213128 | A1 * | 9/2005 | Imai | H04N 1/6077 358/1.9 |
| 2008/0282974 | A1 * | 11/2008 | Takemata | B41F 23/0409 118/620 |
| 2009/0245761 | A1 * | 10/2009 | Nakajima | F27B 17/0025 392/416 |

\* cited by examiner

F I G. 4
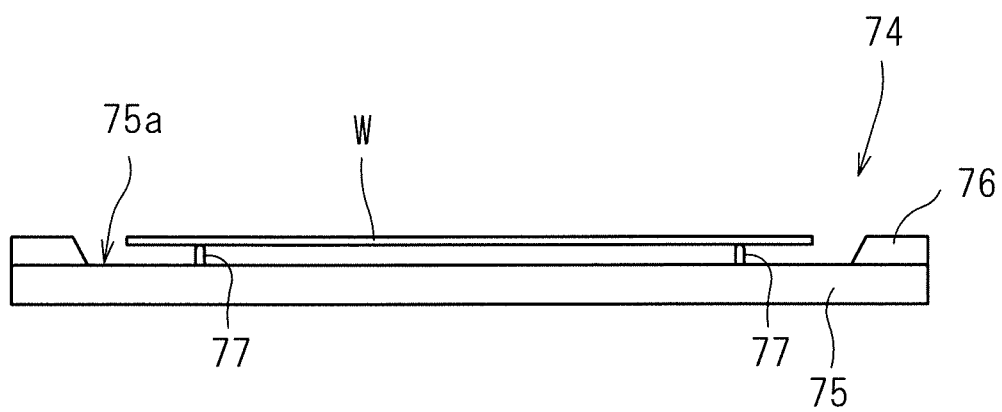

LIGHT-IRRADIATION THERMAL TREATMENT APPARATUS

BACKGROUND OF THE INVENTION

Field of the Invention

The present invention relates to a thermal treatment apparatus configured to heat a thin-plate fine electronic substrate (hereinafter simply referred to as a "substrate") such as a semiconductor wafer by irradiating the substrate with light.

Description of the Background Art

In a process of manufacturing a semiconductor device, flash lamp annealing (FLA) that heats a semiconductor wafer in an extremely short time has attracted attention. The flash lamp annealing is a thermal treatment technology of increasing, for an extremely short time (a few milliseconds or less), the temperature of only a surface of a semiconductor wafer by irradiating the surface of the semiconductor wafer with flash light from a xenon flash lamp (hereinafter simply referring to as "flash lamp" means "xenon flash lamp").

The xenon flash lamp has emission spectral distribution ranging from the ultraviolet region to the near-infrared region. The wavelength of light emitted by the xenon flash lamp is shorter than the wavelength of light emitted by a conventional halogen lamp, and substantially matches with the basic absorption band of a semiconductor wafer made of silicon. Thus, when emitted onto the semiconductor wafer by the xenon flash lamp, only a small amount of flash light is transmitted, and thus the temperature of the semiconductor wafer rapidly increases. It is known that irradiation with flash light for an extremely short time of a few milliseconds or less can achieve selective temperature increase only in the vicinity of the surface of the semiconductor wafer.

Such flash lamp annealing is used in treatment that requires heating for an extremely short time, typically, activation of impurities injected in a semiconductor wafer, for example. When flash light from a flash lamp is incident on a surface of a semiconductor wafer in which impurities are injected by ion injection technique, the temperature of the surface of the semiconductor wafer increases to an activation temperature for an extremely short time, and thus only the impurity activation can be executed without deeply diffusing the impurities.

In thermal treatment as well as the flash lamp annealing, it is important to appropriately manage the temperature of a semiconductor wafer. Typically, temperature is measured by a non-contact radiation thermometer in the thermal treatment of a semiconductor wafer. For example, Japanese Patent Application Laid-open No. 2010-225613 discloses that the temperature of a semiconductor wafer is measured by a radiation thermometer at preheating with a halogen lamp before irradiation with flash light.

Discussion has been made on application of the flash lamp annealing to thermal treatment of a semiconductor wafer on which a high-dielectric-constant film (high-k film) made of a material (high-dielectric-constant material) having a dielectric constant higher than that of silicon dioxide ($SiO_2$) is formed as a gate insulating film for a field effect transistor (FET). The high-dielectric-constant film has been developed as a novel stack structure, together with a metal gate electrode which uses metal for the gate electrode, to solve problems with increase of leakage current that occurs as the thickness of a gate insulating film decreases. Nitriding treatment on such a high-dielectric-constant gate insulating film has been tested in an ammonia atmosphere to thermally treat the high-dielectric-constant gate insulating film in the flash lamp annealing.

However, the thermal treatment of a semiconductor wafer in the ammonia atmosphere causes such a problem that temperature measurement with a radiation thermometer is encumbered by ammonia. Ammonia absorbs infrared used by the radiation thermometer in the measurement, and thus the intensity of infrared received by the radiation thermometer decreases. As a result, the radiation thermometer outputs a measured value lower than the actual wafer temperature. Typically in the flash lamp annealing, a semiconductor wafer is preheated by a halogen lamp before irradiation with flash light, and closed-loop control is performed on the output of the halogen lamp based on a result of measurement with the radiation thermometer. Thus, when the measurement result is lower than the actual wafer temperature, the lamp output is excessive so that the semiconductor wafer is heated to a temperature higher than a target temperature.

SUMMARY OF THE INVENTION

The present invention is directed to a thermal treatment apparatus configured to heat a substrate by irradiating the substrate with light.

According to one aspect of the present invention, a thermal treatment apparatus includes: a chamber that houses a substrate; a light irradiation unit configured to irradiate the substrate housed in the chamber with light; a gas supplying unit configured to supply predetermined treatment gas to the chamber to form an atmosphere of the treatment gas around the substrate; a radiation thermometer configured to measure temperature of the substrate by receiving infrared light emitted from the substrate; a storage unit storing a plurality of conversion tables representing a correlation between energy of infrared light incident on the radiation thermometer and temperature of a black body; and a control unit configured to select a conversion table to be used by the radiation thermometer from the plurality of conversion tables in accordance with the atmosphere of the treatment gas formed in the chamber by the gas supplying unit.

The temperature of a substrate can be accurately measured in an atmosphere of treatment gas that absorbs infrared light.

The present invention is thus intended to accurately measure the temperature of a substrate even in an atmosphere of treatment gas that absorbs infrared light.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a cross-sectional view of the susceptor;

DESCRIPTION OF THE PREFERRED EMBODIMENTS

Preferred embodiments of the present invention will be described in detail below with reference to the accompanying drawings.

Figure 1:
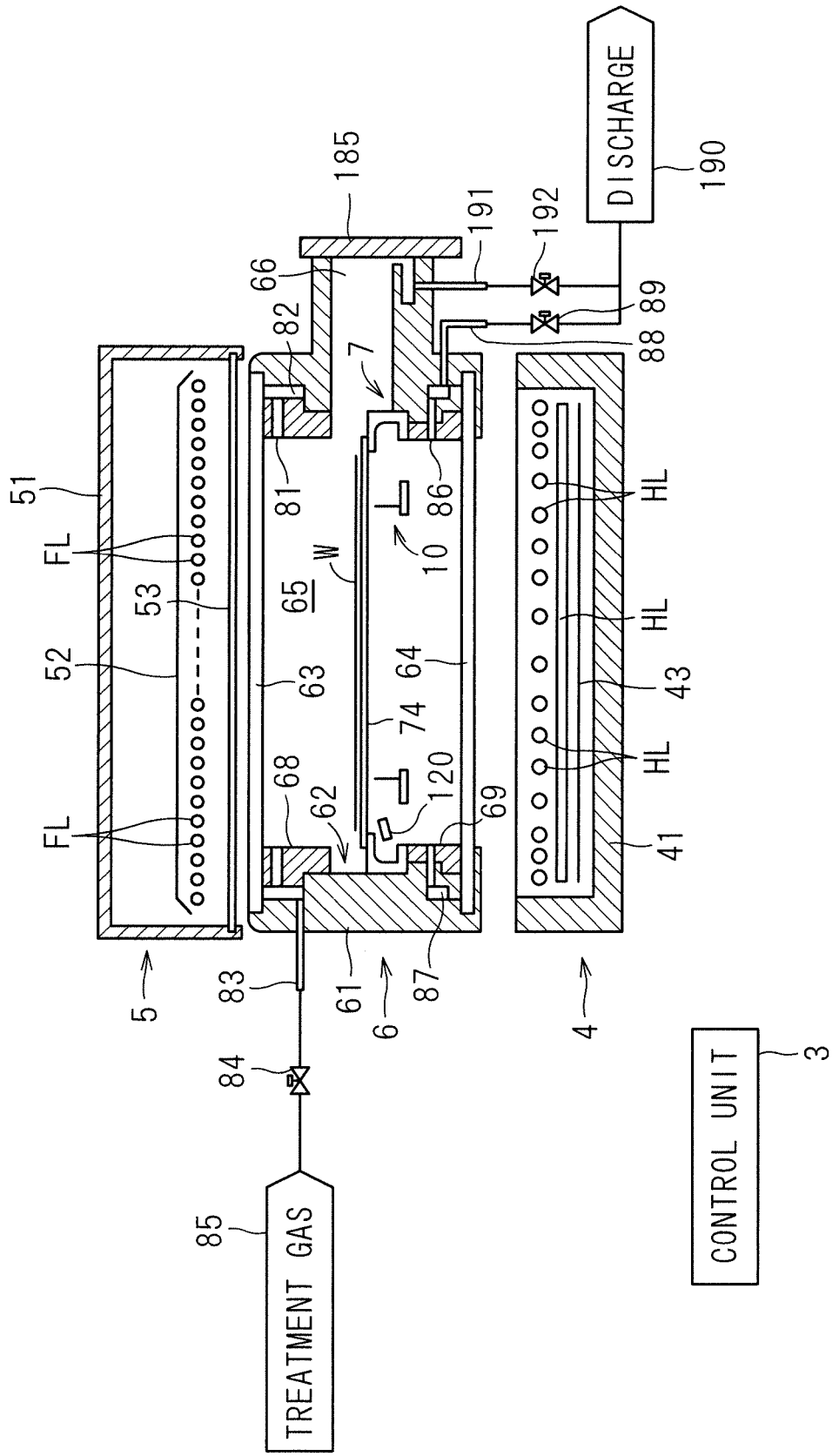
FIG. 1 is a longitudinal sectional view illustrating the configuration of a thermal treatment apparatus according to the present invention.

FIG. 1 is a longitudinal sectional view illustrating the configuration of a thermal treatment apparatus 1 according to the present invention. The thermal treatment apparatus 1 according to the present preferred embodiment is a flash lamp annealer configured to heat a semiconductor wafer W as a substrate having a circular disk shape by irradiating the semiconductor wafer W with flash light. The diameter size of the semiconductor wafer W to be treated is not particularly limited, but may be, for example, 300 mm or 450 mm. In FIG. 1 and the other drawings described below, the dimension of each component and the number thereof are exaggerated or simplified as necessary to facilitate understanding.

The thermal treatment apparatus 1 includes a chamber 6 that houses the semiconductor wafer W, a flash heating unit 5 including a plurality of built-in flash lamps FL, and a halogen heating unit 4 including a plurality of built-in halogen lamps HL. The flash heating unit 5 is provided above the chamber 6, and the halogen heating unit 4 is provided below the chamber 6. The thermal treatment apparatus 1 also includes, inside the chamber 6, a holding unit 7 configured to hold the semiconductor wafer W in a horizontal posture, and a transfer mechanism 10 configured to transfer the semiconductor wafer W between the holding unit 7 and the outside of the apparatus. The thermal treatment apparatus 1 also includes a control unit 3 configured to execute thermal treatment on the semiconductor wafer W by controlling operation mechanisms provided to the halogen heating unit 4, the flash heating unit 5, and the chamber 6.

The chamber 6 includes a tubular chamber side portion 61 and quartz chamber windows mounted on upper and lower parts of the chamber side portion 61. The chamber side portion 61 has a schematically tube shape with openings at the upper and lower parts, the upper opening being blocked with an upper chamber window 63, and the lower opening being blocked with a lower chamber window 64. The upper chamber window 63 as a ceiling part of the chamber 6 is a circular-disk shaped member made of quartz, and functions as a quartz window that transmits, into the chamber 6, flash light emitted by the flash heating unit 5. The lower chamber window 64 as a floor part of the chamber 6 is a circular-disk shaped member made of quartz, and functions as a quartz window that transmits, into the chamber 6, light emitted by the halogen heating unit 4.

A reflection ring 68 is mounted on an upper part of an inner wall surface of the chamber side portion 61, and a reflection ring 69 is mounted on a lower part thereof. The reflection rings 68 and 69 are both shaped in a circular ring. The upper reflection ring 68 is mounted by being inset from above the chamber side portion 61. The lower reflection ring 69 is mounted by being inset from below the chamber side portion 61 and fastened with a screw (not illustrated). In other words, the reflection rings 68 and 69 are both detachably mounted on the chamber side portion 61. A thermal treatment space 65 is defined to be an inner space of the chamber 6, specifically, a space surrounded by the upper chamber window 63, the lower chamber window 64, the chamber side portion 61, and the reflection rings 68 and 69.

When the reflection rings 68 and 69 are mounted on the chamber side portion 61, a recess 62 is formed on an inner wall surface of the chamber 6. The formed recess 62 is enclosed by a central part of the inner wall surface of the chamber side portion 61, on which the reflection rings 68 and 69 are not mounted, a lower end surface of the reflection ring 68, and an upper end surface of the reflection ring 69. The recess 62 is formed in a horizontal circular ring on the inner wall surface of the chamber 6, surrounding the holding unit 7 holding the semiconductor wafer W. The chamber side portion 61 and the reflection rings 68 and 69 are made of a metallic material (for example, stainless steel) having excellent strength and thermal resistance.

The chamber side portion 61 is provided with a conveyance opening (throat) 66 through which the semiconductor wafer W is conveyed into and out of the chamber 6. The conveyance opening 66 can be opened and closed through a gate valve 185. The conveyance opening 66 is communicated and connected with an outer peripheral surface of the recess 62. With this configuration, when the conveyance opening 66 is opened through the gate valve 185, the semiconductor wafer W can be conveyed into or out of the thermal treatment space 65 through the conveyance opening 66 and the recess 62. When the conveyance opening 66 is closed through the gate valve 185, the thermal treatment space 65 inside the chamber 6 is an enclosed space.

A gas supplying hole 81 through which treatment gas (in the present preferred embodiment, mixed gas of nitrogen gas ($N_2$) and ammonia ($NH_3$)) is supplied into the thermal treatment space 65 is provided at an upper part of an inner wall of the chamber 6. The gas supplying hole 81 is provided higher than the recess 62 and may be provided to the reflection ring 68. The gas supplying hole 81 is communicated and connected with a gas supplying tube 83 through a buffer space 82 shaped in a circular ring inside a sidewall of the chamber 6. The gas supplying tube 83 is connected with a treatment-gas supplying source 85. A valve 84 is interposed halfway through the gas supplying tube 83. When the valve 84 is opened, the treatment gas is supplied from the treatment-gas supplying source 85 to the buffer space 82. Having flowed into the buffer space 82, the treatment gas spreads inside the buffer space 82 having a fluid resistance smaller than that of the gas supplying hole 81, and is supplied to the thermal treatment space 65 through the gas supplying hole 81. The treatment gas is not limited to the mixed gas of nitrogen gas and ammonia, but may be reactive gas such as nitrous oxide ($N_2O$), hydrogen sulfide ($H_2S$), nitric oxide (NO), or fluorine gas ($F_2$).

A gas discharging hole 86 through which gas inside the thermal treatment space 65 is discharged is provided at a lower part of the inner wall of the chamber 6. The gas discharging hole 86 is provided lower than the recess 62 and may be provided to the reflection ring 69. The gas discharging hole 86 is communicated and connected with a gas discharging tube 88 through a buffer space 87 shaped in a circular ring inside the sidewall of the chamber 6. The gas discharging tube 88 is connected with a discharge unit 190. A valve 89 is interposed halfway through the gas discharging tube 88. When the valve 89 is opened, gas in the thermal treatment space 65 is discharged to the gas discharging tube 88 through the gas discharging hole 86 and the buffer space 87. A plurality of gas supplying holes 81 and a plurality of gas discharging holes 86 may be provided along a circumferential direction of the chamber 6, and may be each shaped in a slit. The treatment-gas supplying source 85 and the discharge unit 190 may be mechanisms provided to the thermal treatment apparatus 1 or may be utilities of a factory in which the thermal treatment apparatus 1 is installed.

A gas discharging tube 191 through which gas inside the thermal treatment space 65 is discharged is connected with a leading end of the conveyance opening 66.

The gas discharging tube 191 is connected with the discharge unit 190 through a valve 192. When the valve 192 is opened, gas inside the chamber 6 is discharged through the conveyance opening 66.

Figure 2:
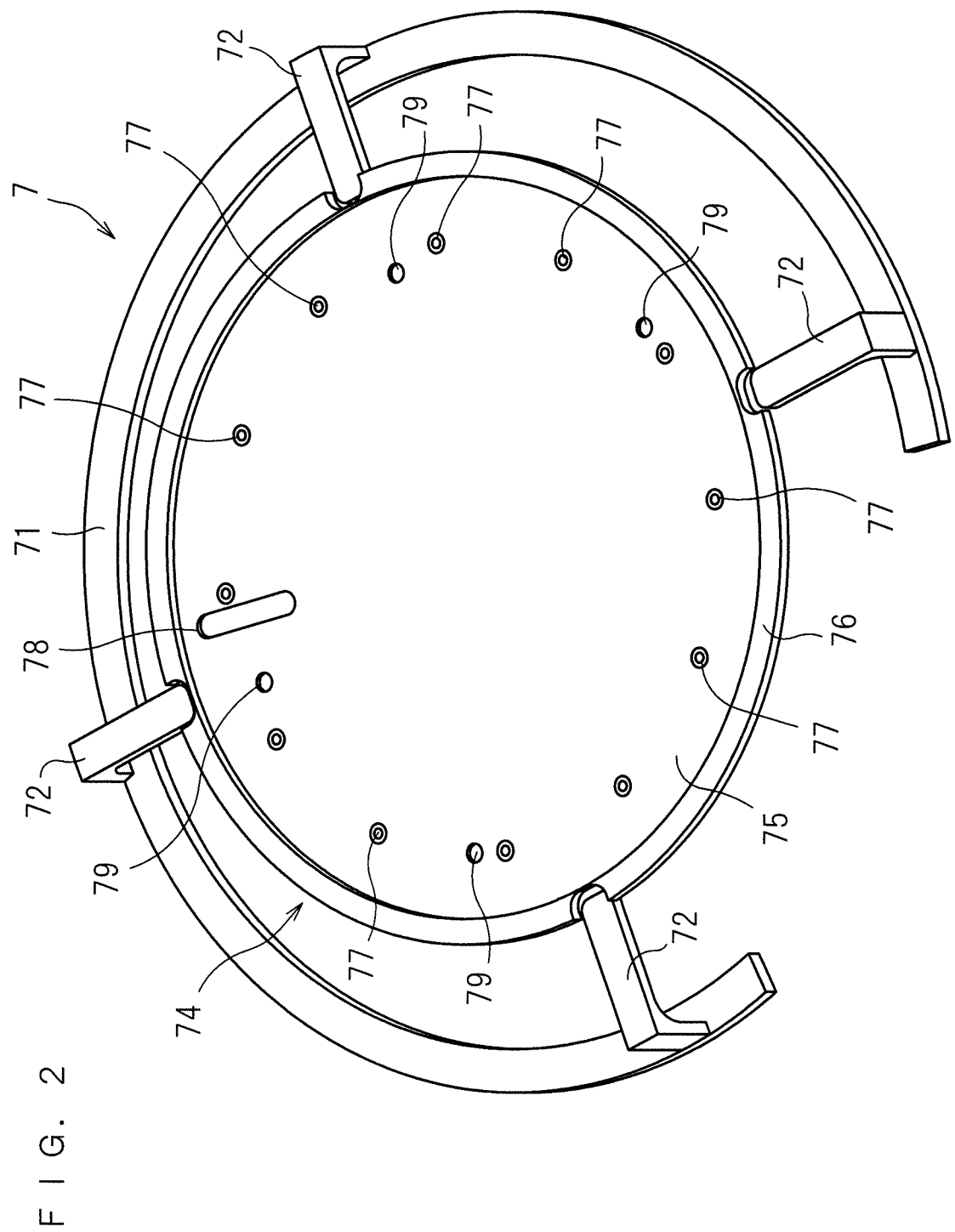
FIG. 2 is a perspective view illustrating the entire appearance of a holding unit.

FIG. 2 is a perspective view illustrating the entire appearance of the holding unit 7. The holding unit 7 includes a base ring 71, a coupling portion 72, and a susceptor 74. The base ring 71, the coupling portion 72, and the susceptor 74 are made of quartz. In other words, the holding unit 7 is entirely made of quartz.

The base ring 71 is a quartz member in an arc shape that lacks part of a circular ring shape. This lacked part is provided to avoid interference between the base ring 71 and transfer anus 11 of the transfer mechanism 10 to be described later. The base ring 71 is placed on a bottom surface of the recess 62 and supported by a wall surface of the chamber 6 (refer to FIG. 1). A plurality (in the present preferred embodiment, four) of the coupling portions 72 are erected on an upper surface of the base ring 71 along a circumferential direction of the circular ring shape thereof. The coupling portion 72 is a quartz member firmly fixed to the base ring 71 by welding.

Figure 3:
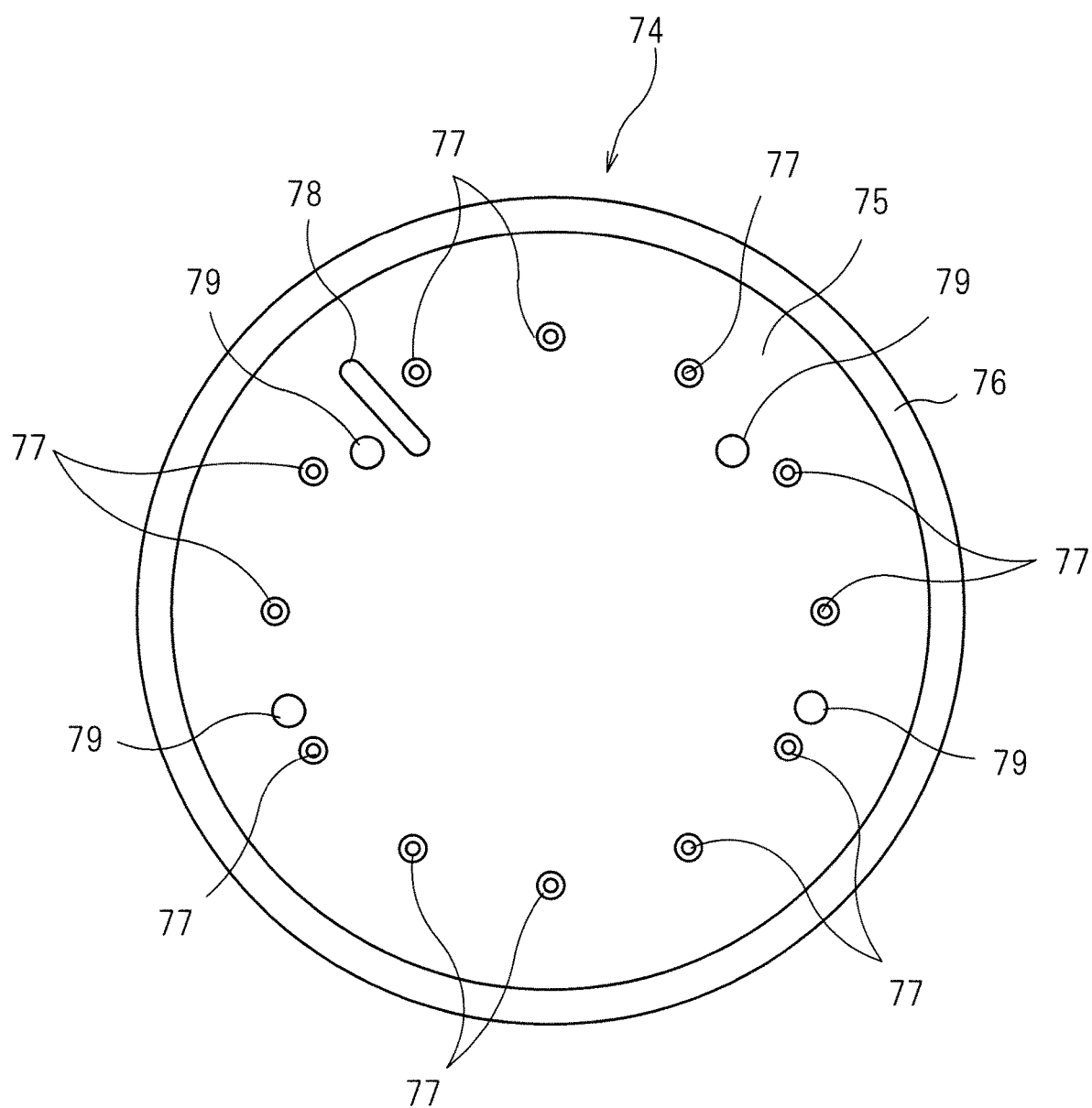
FIG. 3 is a plan view of a susceptor.

The susceptor 74 is supported by the four coupling portions 72 provided to the base ring 71. FIG. 3 is a plan view of the susceptor 74. FIG. 4 is a cross-sectional view of the susceptor 74. The susceptor 74 includes a holding plate 75, a guide ring 76, and a plurality of substrate supporting pins 77. The holding plate 75 is a substantially circular flat plate member made of quartz. The holding plate 75 has a diameter larger than that of the semiconductor wafer W. In other words, the holding plate 75 has a plane size larger than that of the semiconductor wafer W.

The guide ring 76 is installed at a peripheral part of an upper surface of the holding plate 75. The guide ring 76 is shaped in a circular ring having an inner diameter larger than the diameter of the semiconductor wafer W. For example, when the semiconductor wafer W has a diameter of φ300 mm, the guide ring 76 has an inner diameter of φ320 mm. The guide ring 76 has an inner periphery of a tapering surface spreading upward from the holding plate 75. The guide ring 76 is made of quartz like the holding plate 75. The guide ring 76 may be welded to the upper surface of the holding plate 75 or may be fixed to the holding plate 75 through, for example, a separately fabricated pin. Alternatively, the holding plate 75 and the guide ring 76 may be integrally fabricated.

A plane holding surface 75a on which the semiconductor wafer W is held is a region inside the guide ring 76 on the upper surface of the holding plate 75. The plurality of substrate supporting pins 77 are erected on the holding surface 75a of the holding plate 75. In the present preferred embodiment, a total of twelve substrate supporting pins 77 are erected on the circumference of a circle concentric with an outer peripheral circle of the holding surface 75a (inner peripheral circle of the guide ring 76) and separated from each other by 30°. The circle on which the twelve substrate supporting pins 77 are disposed has a diameter (distance between each pair of the facing substrate supporting pins 77) that is smaller than that of the semiconductor wafer W and is, for example, φ270 mm to φ280 mm (in the present preferred embodiment, φ280 mm) when the semiconductor wafer W has a diameter of φ300 mm. The substrate supporting pins 77 are made of quartz. The plurality of substrate supporting pins 77 may be provided on the upper surface of the holding plate 75 by welding or may be fabricated integrally with the holding plate 75.

Referring to FIG. 2 again, the four coupling portions 72 erected on the base ring 71 are firmly fixed to the peripheral part of the holding plate 75 of the susceptor 74 by welding. In other words, the susceptor 74 is fixedly coupled with the base ring 71 through the coupling portions 72. When the holding unit 7 is mounted on the chamber 6, the base ring 71 of the holding unit 7 is supported by the wall surface of the chamber 6. In the state in which the holding unit 7 is mounted on the chamber 6, the holding plate 75 of the susceptor 74 is in a horizontal posture (in which the normal thereof aligns with a vertical direction). In other words, the holding surface 75a of the holding plate 75 is a horizontal plane.

When conveyed into the chamber 6, the semiconductor wafer W is placed and held in a horizontal posture on the susceptor 74 of the holding unit 7 mounted on the chamber 6. When held on the susceptor 74, the semiconductor wafer W is supported by the twelve substrate supporting pins 77 erected on the holding plate 75. More precisely, upper end parts of the twelve substrate supporting pins 77 are in contact with a lower surface of the semiconductor wafer W, supporting the semiconductor wafer W. The twelve substrate supporting pins 77 have uniform heights (distance between an upper end of each substrate supporting pin 77 and the holding surface 75a of the holding plate 75), and thus the semiconductor wafer W can be supported in the horizontal posture by the twelve substrate supporting pins 77.

The plurality of substrate supporting pins 77 support the semiconductor wafer W at a position separated from the holding surface 75a of the holding plate 75 by a predetermined interval. The guide ring 76 has a thickness larger than the heights of the substrate supporting pins 77. With this configuration, the guide ring 76 prevents a horizontal positional shift of the semiconductor wafer W supported by the plurality of substrate supporting pins 77.

As illustrated in FIGS. 2 and 3, a vertical opening 78 is formed in the holding plate 75 of the susceptor 74. The opening 78 is provided to allow a radiation thermometer 120 (refer to FIG. 1) to receive radiation light (infrared light) emitted from the lower surface of the semiconductor wafer W held by the susceptor 74. Specifically, the radiation thermometer 120 measures the temperature of the semiconductor wafer W by receiving, through the opening 78, the infrared light emitted from the lower surface of the semiconductor wafer W held by the susceptor 74. In addition, four through-holes 79 are drilled through the holding plate 75 of the susceptor 74. Lift pins 12 of the transfer mechanism 10 to be described later penetrate through the through-holes 79 for transferring the semiconductor wafer W. The temperature measurement with the radiation thermometer 120 will be described later.

Figure 5:
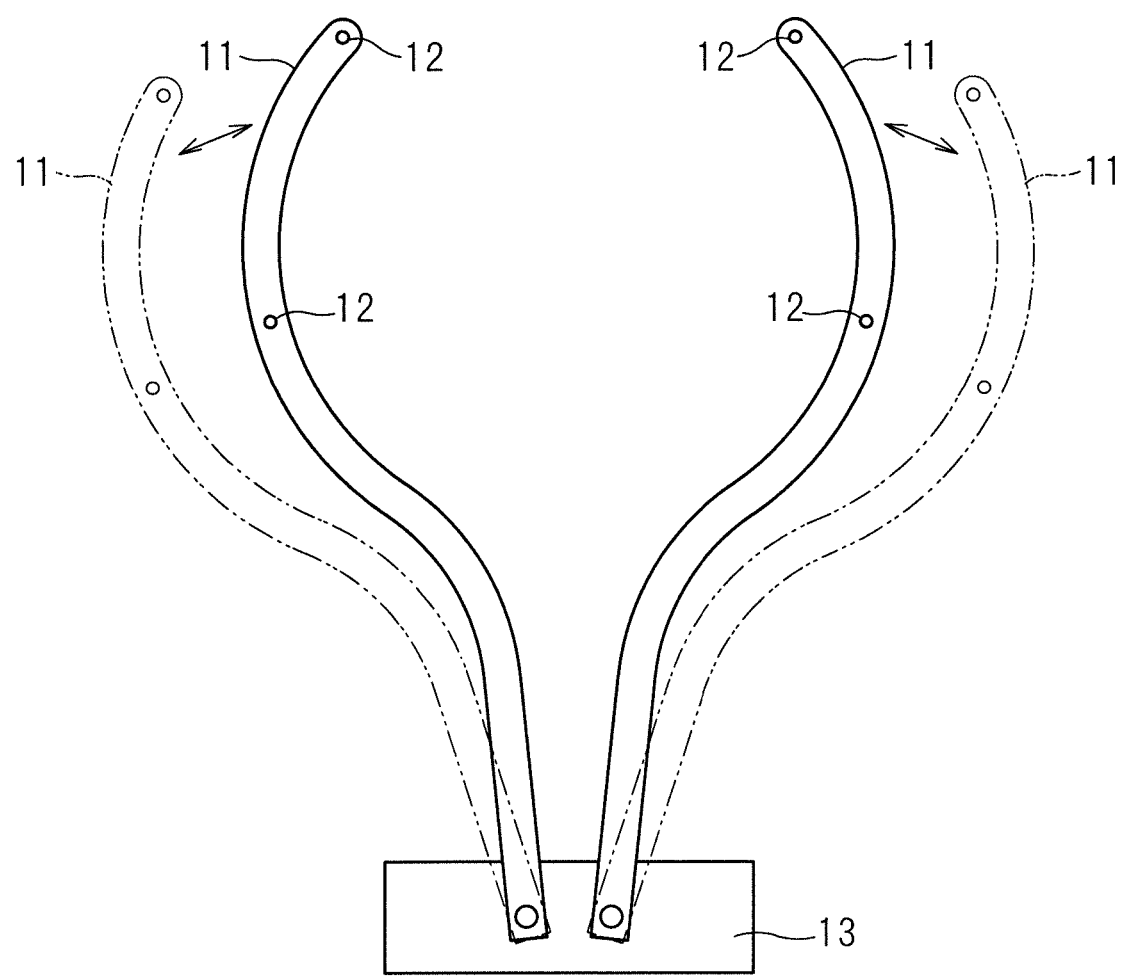
FIG. 5 is a plan view of a transfer mechanism.
Figure 6:
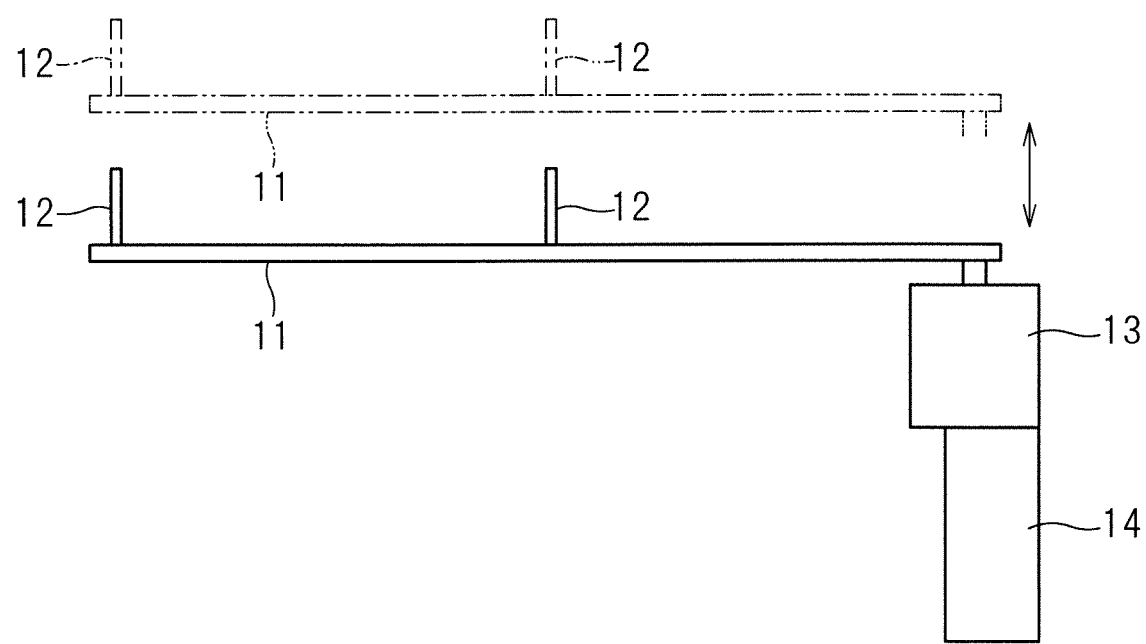
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer anus 11 have arc shapes along the substantially circular-ring shaped recess 62. Two of the lift pins 12 are erected on each transfer arm 11. The transfer arms 11 can be rotated by a horizontal movement mechanism 13. The horizontal movement mechanism 13 horizontally moves each of the transfer arms 11 in a pair between a transfer operation position (illustrated with solid lines in FIG. 5) for transferring the semiconductor wafer W to the holding unit 7 and a retracted position (illustrated with dashed and double-dotted lines in FIG. 5) for avoiding overlapping between the transfer arm 11 and the semiconductor wafer W held by the holding unit 7 in plan view. The horizontal movement mechanism 13 may be configured to rotate each transfer arm 11 through an individual motor or rotate the pair of the transfer arms 11 in a coupled manner through a single motor by using a link mechanism.

The pair of the transfer arms 11 is vertically moved together with the horizontal movement mechanism 13 by an elevation mechanism 14. When the elevation mechanism 14 moves up the pair of the transfer arms 11 at the transfer operation position, a total of four of the lift pins 12 pass through the through-holes 79 (refer to FIGS. 2 and 3) drilled through the susceptor 74, and upper ends of the lift pins 12 protrude out of an upper surface of the susceptor 74. When the elevation mechanism 14 moves down the pair of the transfer arms 11 at the transfer operation position to remove the lift pins 12 from the through-holes 79, and the horizontal movement mechanism 13 opens the pair of the transfer arms 11, the transfer arms 11 move to the retracted position. The retracted position of the pair of the transfer arms 11 is directly above the base ring 71 of the holding unit 7. Since the base ring 71 is placed on the bottom surface of the recess 62, the retracted position of the transfer arms 11 is inside the recess 62. A discharge mechanism (not illustrated) is provided near sites where drive units (the horizontal movement mechanism 13 and the elevation mechanism 14) of the transfer mechanism 10 are provided, and is configured to discharge atmosphere around the drive units of the transfer mechanism 10 outside the chamber 6.

Referring to FIG. 1 again, the flash heating unit 5 provided above the chamber 6 includes, inside a housing 51, a light source including a plurality (in the present preferred embodiment, 30) of xenon flash lamps FL, and a reflector 52 provided to cover over the light source. A lamp light emission window 53 is mounted at a bottom part of the housing 51 of the flash heating unit 5. The lamp light emission window 53 serving as a floor part of the flash heating unit 5 is a plate quartz window. When the flash heating unit 5 is installed above the chamber 6, the lamp light emission window 53 faces to the upper chamber window 63. The flash lamps FL irradiate the thermal treatment space 65 with flash light from above the chamber 6 through the lamp light emission window 53 and the upper chamber window 63.

The plurality of flash lamps FL are each a bar lamp having a long cylindrical shape, and are arrayed in a plane such that longitudinal directions thereof are parallel to each other along a main surface of the semiconductor wafer W held by the holding unit 7 (along a horizontal direction). Thus, the plane formed by the array of the flash lamps FL is a horizontal plane.

The xenon flash lamps FL each include a bar glass tube (discharge tube) in which xenon gas is encapsulated and at both end parts of which an anode and a cathode are disposed and connected with a capacitor, and a trigger electrode attached onto an outer peripheral surface of the glass tube. Since xenon gas is an electrical insulator, no electricity flows in the glass tube in a normal state while electric charge is accumulated in the capacitor. However, when high voltage is applied to the trigger electrode to break down insulation, electricity accumulated in the capacitor instantaneously flows into the glass tube, and light is emitted through excitation of xenon atoms or molecules. In the xenon flash lamps FL thus configured, electrostatic energy accumulated in the capacitor in advance is converted into an extremely short light pulse of 0.1 millisecond to 100 milliseconds. Thus, the xenon flash lamps FL are capable of performing irradiation with extremely intensive light as compared to a continuously turned-on light source such as the halogen lamps HL. In other words, the flash lamps FL are pulsed light emission lamps configured to instantaneously emit light in an extremely short time less than one second. The time of light emission by the flash lamps FL can be adjusted through the coil constant of a lamp power source configured to supply electrical power to the flash lamps FL.

The reflector 52 is provided above the plurality of flash lamps FL to entirely cover the flash lamps FL. The reflector 52 basically reflects flash light emitted by the plurality of flash lamps FL toward the thermal treatment space 65. The reflector 52 is formed of an aluminum alloy plate and has a surface (toward the flash lamps FL) roughened by blast treatment.

The halogen heating unit 4 provided below the chamber 6 includes, inside a housing 41, a plurality (in the present preferred embodiment, 40) of the halogen lamps HL. The halogen heating unit 4 is a light irradiation unit configured to heat the semiconductor wafer W by performing irradiation with light from the plurality of halogen lamps HL into the thermal treatment space 65 through the lower chamber window 64 from below the chamber 6.

Figure 7:
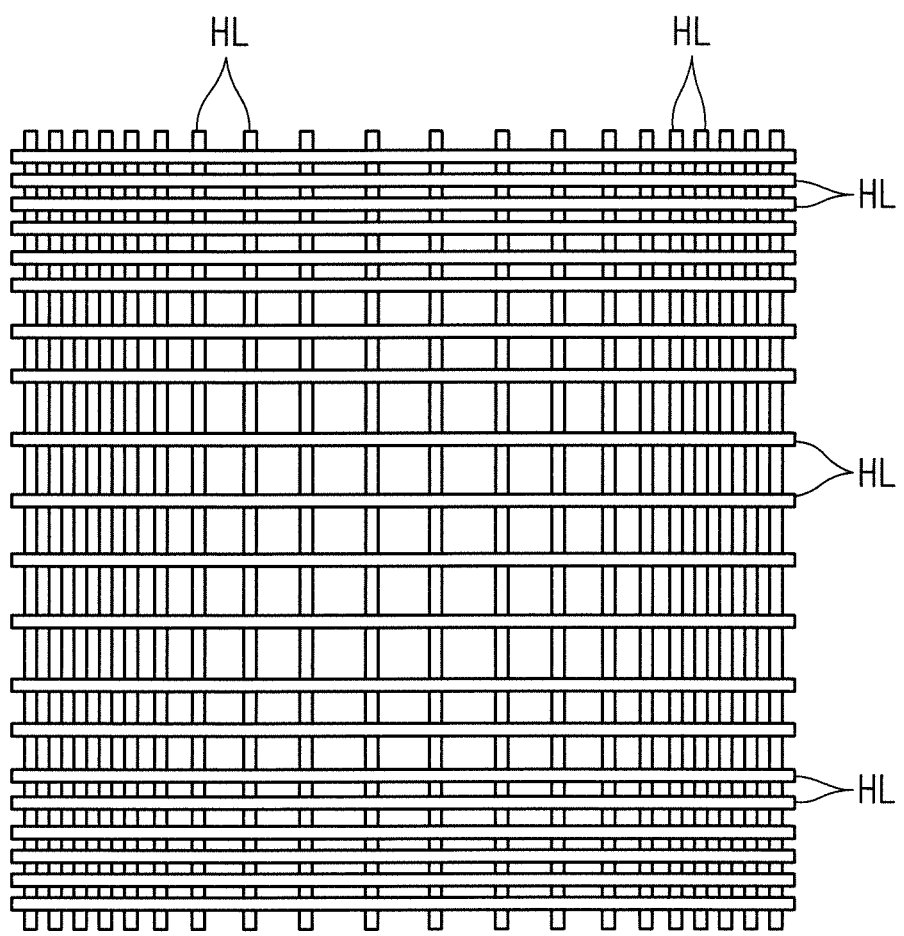
FIG. 7 is a plan view illustrating arrangement of a plurality of halogen lamps.

FIG. 7 is a plan view illustrating arrangement of the plurality of halogen lamps HL. The 40 halogen lamps HL are arranged separately in upper and lower parts. Twenty of the halogen lamps HL are arranged in the upper part closer to the holding unit 7, and the other twenty halogen lamps HL are arranged in the lower part farther apart from the holding unit 7 than the upper part. The halogen lamps HL are each a bar lamp having a long cylindrical shape. The twenty halogen lamps HL in each of the upper and lower parts are arrayed such that longitudinal directions thereof are parallel to each other along the main surface of the semiconductor wafer W held by the holding unit 7 (along the horizontal direction). Thus, in each of the upper and lower parts, a plane formed by the array of the halogen lamps HL is a horizontal plane.

As illustrated in FIG. 7, in each of the upper and lower parts, the halogen lamps HL are arranged more densely in a region facing to a peripheral part of the semiconductor wafer W held by the holding unit 7 than in a region facing to a central part of the semiconductor wafer W. In other words, in each of the upper and lower parts, the halogen lamps HL are arranged at shorter pitches in the peripheral part of the lamp array than in the central part thereof. Thus, at heating through irradiation with light from the halogen heating unit 4, irradiation with a larger quantity of light can be performed at the peripheral part of the semiconductor wafer W where temperature decrease is likely to occur.

The halogen lamps HL in the upper and lower parts are arrayed in such a lattice shape that the halogen lamps HL in the upper part intersect with the halogen lamps HL in the lower part. In other words, the 40 halogen lamps HL are arranged such that the longitudinal directions of the twenty halogen lamps HL arranged in the upper part are orthogonal to the longitudinal directions of the twenty halogen lamps HL arranged in the lower part.

The halogen lamps HL are each a filament light source configured to emit light by heating a filament disposed inside the glass tube to be incandescent through energization to the filament. The glass tube encapsulates inert gas, such as nitrogen or argon, containing a small amount of halogen element (for example, iodine or bromine). The halogen element allows setting of the temperature of the filament to a high temperature while reducing damage on the filament. Thus, each halogen lamp HL has a longer lifetime and can continuously emit more intensive light as compared to a normal filament lamp. In other words, the halogen lamps HL are continuously turned-on lamps configured to continuously emit light for at least one second. Moreover, being bar lamps, the halogen lamps HL have long lifetime. When the halogen lamps HL are arranged along the horizontal direction, an excellent efficiency of emission to the semiconductor wafer W above can be obtained.

A reflector 43 is provided below the halogen lamps HL in the two parts in the housing 41 of the halogen heating unit 4 (FIG. 1). The reflector 43 reflects light emitted by the plurality of halogen lamps HL toward the thermal treatment space 65.

Figure 8:
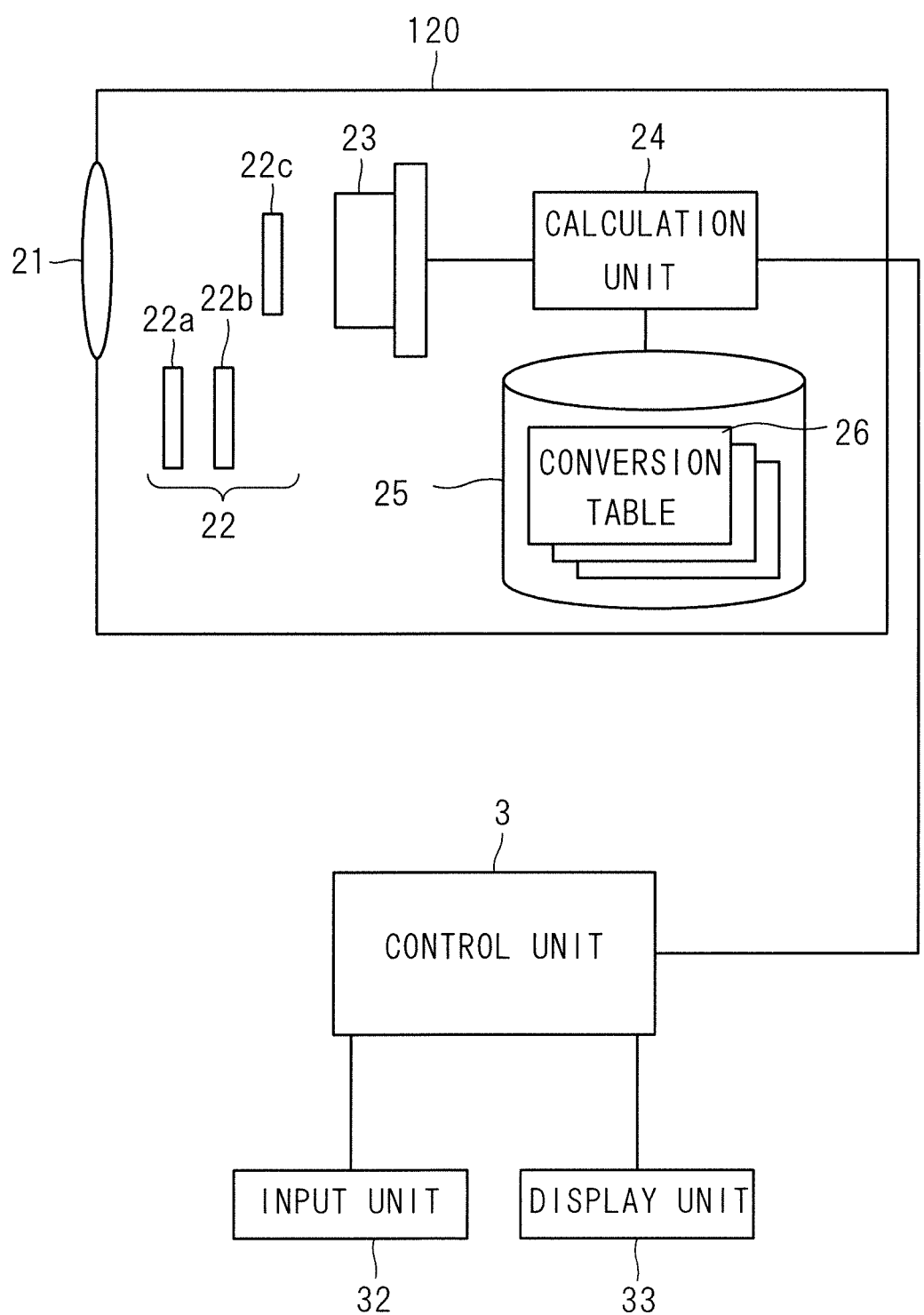
FIG. 8 is a diagram schematically illustrating the configuration of a radiation thermometer.

As illustrated in FIG. 1, the chamber 6 includes the radiation thermometer 120 configured to measure the temperature of the semiconductor wafer W by receiving infrared light emitted from the semiconductor wafer W. FIG. 8 is a diagram schematically illustrating the configuration of the radiation thermometer 120. The radiation thermometer 120 includes an optical lens system 21, a filter 22, a detector 23, a calculation unit 24, and a storage unit 25. The optical lens system 21 condenses, onto the detector 23, light incident from the outside of the radiation thermometer 120. Having received infrared light, the detector 23 generates an output signal in accordance with the energy of the infrared light. The detector 23 is, for example, a thermopile.

The filter 22 is an optical filter configured to selectively transmit light in a predetermined wavelength band. In the present preferred embodiment, three filters 22a, 22b, and 22c are provided and configured to transmit light in wavelength bands different from each other. Any one of the three filters 22a, 22b, and 22c is selected and installed between the optical lens system 21 and the detector 23 (in the example illustrated in FIG. 8, the filter 22c is selected and installed between the optical lens system 21 and the detector 23). The installation of the filter 22 at a predetermined position between the optical lens system 21 and the detector 23 may be manually performed by a worker or may be automatically performed by using a forward-backward drive mechanism. Alternatively, two or three of the three filters 22a, 22b, and 22c may be selected and installed between the optical lens system 21 and the detector 23. Alternatively, none of the three filters 22a, 22b, and 22c may be installed between the optical lens system 21 and the detector 23. When not needed to be distinguished, the three filters 22a, 22b, and 22c are collectively referred to as the filter 22.

The calculation unit 24 calculates the temperature of a measurement target (in the present preferred embodiment, the semiconductor wafer W) based on the output signal from the detector 23. Although Stefan-Boltzmann law and Planck's law, which describe a relation between temperature and radiant energy, are used under the basic principle of measurement with a radiation thermometer, typically used in many cases is a conversion table produced by actually measuring radiant energy from a blackbody furnace as a reference. The radiation thermometer 120 in the present preferred embodiment performs the temperature calculation by using a conversion table 26. Specifically, the level of the output signal from the detector 23 when the radiation thermometer 120 receives infrared light emitted from a blackbody furnace set to a predetermined temperature is recorded. The conversion table 26 is produced by recording the level of the output signal from the detector 23 for different temperatures set to the blackbody furnace.

Figure 10:
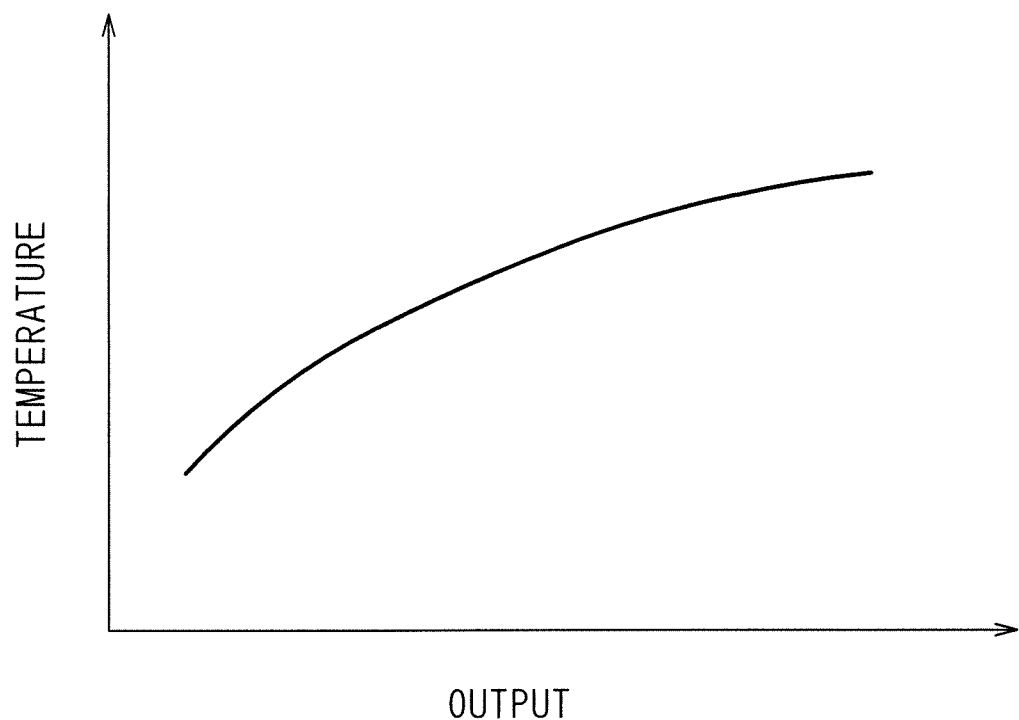
FIG. 10 is a diagram illustrating an exemplary conversion table.

FIG. 10 is a diagram illustrating an exemplary conversion table 26. The conversion table 26 directly represents a correlation between the level of the output signal from the detector 23 and the temperature of the black body. The level of the output signal from the detector 23 depends on the energy of infrared light incident on the radiation thermometer 120, and thus the conversion table 26 represents a correlation between the energy of infrared light incident on the radiation thermometer 120 and the temperature of the black body.

Since the semiconductor wafer W in reality is not a black body (perfect radiator with emissivity $\epsilon=1$), the calculation unit 24 of the radiation thermometer 120 calculates the temperature of the semiconductor wafer W based on the emissivity of the semiconductor wafer W and the conversion table 26.

The radiation thermometer 120 has a reference measurement wavelength band defined in accordance with the element kind of the detector 23. When a thermopile is used as the detector 23 as in the present preferred embodiment, the measurement wavelength band is 6 μm to 20 μm. In other words, the radiation thermometer 120 calculates the temperature of the semiconductor wafer W from the energy of infrared light having a wavelength of 6 μm to 20 μm among incident light.

The radiation thermometer 120 in the present preferred embodiment is provided with the filter 22. The filter 22 selectively transmits light in a predetermined wavelength band. For example, the filter 22c selectively transmits infrared light having a wavelength of 7 μm to 8 μm (in other words, the filter 22c discards light having a wavelength shorter than 7 μm and longer than 8 μm). When taking the temperature measurement with the radiation thermometer 120, without providing filter 22, namely using the conversion table 26 produced with the measurement wavelength band of 6 μm to 20 μm while providing filter 22c, a measurement error is led since the wavelength band of the infrared light received by the detector 23 becomes narrow. To avoid this, a plurality of conversion tables 26 are produced in the present preferred embodiment. Specifically, the conversion table 26 is produced for each case in which any of the filters 22a, 22b, and 22c is installed between the optical lens system 21 and the detector 23. For example, when the filter 22c is installed, the conversion table 26 for the measurement wavelength band of 7 μm to 8 μm is produced. The conversion table 26 is also produced for a case in which none of the filters 22a, 22b, and 22c is installed between the optical lens system 21 and the detector 23. The plurality of conversion tables 26 thus produced are stored in the storage unit 25 of the radiation thermometer 120.

The radiation thermometer 120 is electrically connected with the control unit 3 of the thermal treatment apparatus 1. The control unit 3 controls various kinds of operation mechanisms provided to the thermal treatment apparatus 1. The control unit 3 has a hardware configuration similar to that of a typical computer. Specifically, the control unit 3 includes a CPU as a circuit configured to perform various kinds of arithmetic processing, a ROM as a read-only memory storing a basic program, a RAM as a readable/writable memory storing various kinds of information, and a magnetic disk storing, for example, control software and data. Treatment at the thermal treatment apparatus 1 proceeds as the CPU of the control unit 3 executes a predetermined treatment program.

The control unit 3 is connected with an input unit 32 and a display unit 33. The input unit 32 may include various kinds of well-known input instruments such as a keyboard and a mouse. The display unit 33 is a display panel such as a liquid crystal display provided on, for example, an outer wall of the thermal treatment apparatus 1. The input unit 32 and the display unit 33 may be a touch panel having functions of the both units.

In addition to the above-described components, the thermal treatment apparatus 1 includes various cooling structures to prevent excessive temperature increase at the halogen heating unit 4, the flash heating unit 5, and the chamber 6 due to thermal energy generated by the halogen lamps HL and the flash lamps FL at thermal treatment of the semiconductor wafer W. For example, a water-cooling tube (not illustrated) is provided on a wall of the chamber 6. The halogen heating unit 4 and the flash heating unit 5 each have an air cooling structure that removes heat by forming gas flow inside. Air is supplied to a gap between the upper chamber window 63 and the lamp light emission window 53 to cool the flash heating unit 5 and the upper chamber window 63.

Figure 9:
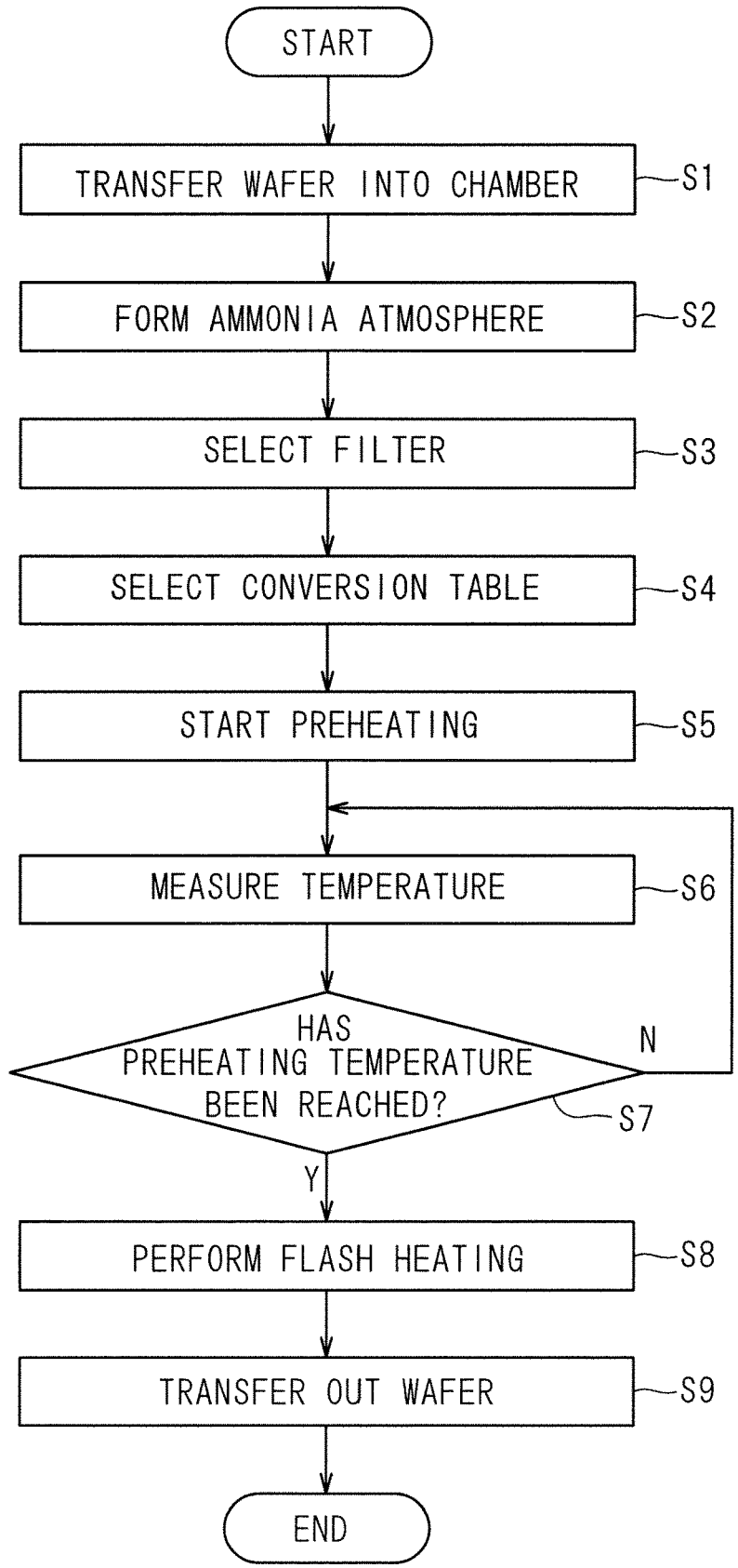
FIG. 9 is a flowchart illustrating a procedure of treatment on a semiconductor wafer.

The following describes a procedure of treatment on the semiconductor wafer W. FIG. 9 is a flowchart illustrating the procedure of treatment on the semiconductor wafer W. The semiconductor wafer W to be treated is a semiconductor substrate on which a high-dielectric-constant film is formed as a gate insulating film. The thermal treatment apparatus 1 performs post deposition annealing (PDA) by irradiating the semiconductor wafer W with flash light. The procedure of treatment on the thermal treatment apparatus 1 described below proceeds as the control unit 3 controls each operation mechanism of the thermal treatment apparatus 1.

First, the semiconductor wafer W to be treated is conveyed into the chamber 6 of the thermal treatment apparatus 1 (step S1). When the semiconductor wafer W is conveyed in, the gate valve 185 is opened to leave the conveyance opening 66 open, and then the semiconductor wafer W is conveyed into the thermal treatment space 65 inside the chamber 6 through the conveyance opening 66 by a conveyance robot outside the apparatus. In this case, the valve 84 may be opened to continuously supply nitrogen gas into the chamber 6 and allow the nitrogen gas to flow out of the conveyance opening 66, thereby minimizing flow of atmosphere outside the apparatus into the chamber 6. Having been conveyed in by the conveyance robot, the semiconductor wafer W proceeds to a position directly above the holding unit 7 and stops. Then, as the pair of the transfer arms 11 of the transfer mechanism 10 is horizontally moved from the retracted position to the transfer operation position and moved up, the lift pins 12 protrude out of the upper surface of the susceptor 74 through the through-holes 79 and receive the semiconductor wafer W. In this state, the lift pins 12 are raised to be higher than the upper ends of the substrate supporting pins 77.

After the semiconductor wafer W is placed on the lift pins 12, the conveyance robot exits from the thermal treatment space 65, and the gate valve 185 closes the conveyance opening 66. Then, as the pair of the transfer arms 11 is lowered, the semiconductor wafer W is transferred from the transfer mechanism 10 to the susceptor 74 of the holding unit 7 and held in a horizontal posture from below. Being held by the susceptor 74, the semiconductor wafer W is supported by the plurality of substrate supporting pins 77 erected on the holding plate 75. The front surface of the semiconductor wafer W being held by the holding unit 7, on which the high-dielectric-constant film is formed, faces upward. A predetermined interval is provided between a back surface (main surface opposite to the front surface on which the high-dielectric-constant film is formed) of the semiconductor wafer W supported by the plurality of substrate supporting pins 77 and the holding surface 75a of the holding plate 75. When lowered below the susceptor 74, the pair of the transfer arms 11 is retracted to the retracted position, in other words, inside the recess 62 by the horizontal movement mechanism 13.

After the semiconductor wafer W is housed in the chamber 6 and the conveyance opening 66 is closed by the gate valve 185 to seal the thermal treatment space 65, treatment gas is supplied into the chamber 6 to form an ammonia atmosphere in the thermal treatment space 65 (step S2). Specifically, the valve 84 is opened to supply the treatment gas into the thermal treatment space 65 through the gas supplying hole 81, and simultaneously, the valve 89 is opened to discharge gas inside the chamber 6 through the gas discharging hole 86. In the present preferred embodiment, the treatment gas supplied into the thermal treatment space 65 inside the chamber 6 is mixed gas of ammonia and nitrogen. The treatment gas supplied from an upper part of the thermal treatment space 65 inside the chamber 6 flows downward and is discharged from a lower part of the thermal treatment space 65 to form an ammonia atmosphere around the semiconductor wafer W held by the holding unit 7 in the chamber 6. The concentration of ammonia in the ammonia atmosphere (in other words, a mixture ratio of ammonia and nitrogen gas) is, for example, 10 vol. % or less, and in the present preferred embodiment, the concentration of ammonia in the ammonia atmosphere is 3.5 vol. % approximately.

The ammonia atmosphere formed in the chamber 6 does not necessarily need to be formed of the mixed gas of ammonia and nitrogen supplied as the treatment gas, but the concentration of ammonia may be set to 100 vol. % depending on the content of treatment. When the valve 192 is opened, gas inside the chamber 6 is also discharged through the conveyance opening 66. In addition, the atmosphere around the drive units of the transfer mechanism 10 is discharged by the discharge mechanism (not illustrated).

As described above, in the radiation thermometer 120 in the present preferred embodiment, the detector 23 is a thermopile and has a measurement wavelength band of 6 μm to 20 μm. It is known that ammonia absorbs infrared in wavelength bands of 5 μm to 7 μm and 8 μm to 14 μm. In other words, the measurement wavelength band of the radiation thermometer 120 partially overlaps with the absorption wavelength band of ammonia, and thus the temperature measurement with the radiation thermometer 120 is potentially encumbered by ammonia inside the chamber 6.

For this reason, in the present preferred embodiment, the filter 22 is provided to discard infrared light in the absorption wavelength band of ammonia. Specifically, the filter 22c, which selectively transmits infrared light having a wavelength of 7 μm to 8 μm, is selected from the filters 22a, 22b, and 22c and installed between the optical lens system 21 and the detector 23 (step S3). The absorption rate of ammonia is extremely low in the wavelength of 7 μm to 8 μm. Thus, when the filter 22c is provided, the radiation thermometer 120 can measure the temperature of the semiconductor wafer W without being affected by the infrared light absorption by ammonia.

However, since the measurement wavelength band of the radiation thermometer 120 is changed to the wavelength of 7 μm to 8 μm when the filter 22c is provided, the temperature measurement cannot be accurately performed unless the conversion table 26 suitable for this measurement wavelength band is used. Thus, when having detected installation of the filter 22c, the control unit 3 selects the conversion table 26 corresponding to the filter 22c from the plurality of conversion tables 26 and uses the selected conversion table 26 at the calculation unit 24 of the radiation thermometer 120 (step S4). The conversion table 26 corresponding to the filter 22c is a conversion table produced for the filter 22c installed between the optical lens system 21 and the detector 23. The control unit 3 passes the emissivity of the semiconductor wafer W to the calculation unit 24 of the radiation thermometer 120. The control unit 3 may acquire the emissivity of the semiconductor wafer W from, for example, a treatment recipe (describing the procedure and condition of treatment on the semiconductor wafer W to be treated).

Subsequently, the 40 halogen lamps HL of the halogen heating unit 4 are turned on at once to start preheating (assist heating) of the semiconductor wafer W (step S5). Halogen light emitted by the halogen lamps HL transmits through the lower chamber window 64 and the susceptor 74 made of quartz and is incident on the back surface of the semiconductor wafer W. The semiconductor wafer W is preheated through reception of the irradiation light from the halogen lamps HL, and accordingly the temperature of the semiconductor wafer W increases. The transfer arms 11 of the transfer mechanism 10, which are being retracted inside the recess 62, do not interfere the heating with the halogen lamps HL.

At the preheating with the halogen lamps HL, the radiation thermometer 120 measures the temperature of the semiconductor wafer W (step S6). Specifically, the radiation thermometer 120 measures the increasing temperature of the wafer by receiving infrared light emitted through the opening 78 from the back surface of the semiconductor wafer W held by the susceptor 74. In this case, although light in wavelength bands of 5 μm to 7 μm and 8 μm to 14 μm among the infrared light emitted from the semiconductor wafer W is absorbed by ammonia in the atmosphere, the radiation thermometer 120 can measure the temperature of the semiconductor wafer W without being affected by the absorption by ammonia because the filter 22c, which selectively transmits infrared light having a wavelength of 7 μm to 8 μm, is provided between the optical lens system 21 and the detector 23. Moreover, the calculation unit 24 of the radiation thermometer 120 can accurately measure the temperature of the semiconductor wafer W by applying the emissivity of the semiconductor wafer W to the conversion table 26 corresponding to the filter 22c and calculating the temperature of the semiconductor wafer W based on the output signal from the detector 23.

The temperature of the semiconductor wafer W measured by the radiation thermometer 120 is notified to the control unit 3. The control unit 3 controls outputs of the halogen lamps HL while monitoring whether the temperature of the semiconductor wafer W, which increases through irradiation with light from the halogen lamps HL, has reached at a predetermined preheating temperature T1. Specifically, the control unit 3 performs, based on a result of the measurement with the radiation thermometer 120, feedback control of the outputs of the halogen lamps HL so that the temperature of the semiconductor wafer W becomes equal to the preheating temperature T1 (steps S6 and S7). Since the temperature of the semiconductor wafer W in the ammonia atmosphere, which absorbs infrared light, is accurately measured by the radiation thermometer 120, the control unit 3 can appropriately control the outputs of the halogen lamps HL. The preheating temperature T1 is between 300° C. and 600° C. inclusive, and is 450° C. in the present preferred embodiment.

After the temperature of the semiconductor wafer W has reached the preheating temperature T1, the control unit 3 temporarily maintains the semiconductor wafer W at the preheating temperature T1. Specifically, when the temperature of the semiconductor wafer W measured by the radiation thermometer 120 has reached the preheating temperature T1, the control unit 3 adjusts the outputs of the halogen lamps HL to maintain the temperature of the semiconductor wafer W substantially at the preheating temperature T1.

The temperature of the entire semiconductor wafer W including the high-dielectric-constant film is uniformly increased to the preheating temperature T1 through the preheating with the halogen lamps HL. At the stage of the preheating with the halogen lamps HL, the temperature of the semiconductor wafer W tends to decrease by a larger amount at the peripheral part thereof, from which heat is more likely to be released, than at the central part thereof. However, since the halogen lamps HL of the halogen heating unit 4 are arranged more densely in the region facing to the peripheral part of the semiconductor wafer W than in the region facing to the central part thereof, a larger quantity of light is incident on the peripheral part of the semiconductor wafer W, from which heat is likely to be released. With this configuration, the semiconductor wafer W at the preheating stage can have uniform in-plane temperature distribution.

Subsequently, when a predetermined time has elapsed since the temperature of the semiconductor wafer W reached the preheating temperature T1, the flash heating unit 5 executes flash heating treatment by irradiating the surface of the semiconductor wafer W with flash light from the flash lamps FL (step S8). In this case, part of the flash light emitted by the flash lamps FL travels directly into the chamber 6, and the other part thereof travels into the chamber 6 after temporarily reflected by the reflector 52. Flash heating of the semiconductor wafer W is performed through irradiation with these parts of the flash light.

Since the flash heating is performed through irradiation with the flash light from the flash lamps FL, the temperature of the front surface of the semiconductor wafer W can be increased in a short time. Specifically, the flash light emitted by the flash lamps FL is extremely short and intensive light having an irradiation time of 0.1 millisecond to 100 milliseconds approximately. This flash light is generated through conversion of electrostatic energy accumulated in the capacitor in advance into an extremely short light pulse. Then, the temperature of the front surface of the semiconductor wafer W, which is subjected to the flash heating through irradiation with the flash light from the flash lamps FL, instantaneously increases to a treatment temperature T2, and post deposition anneal is executed on the high-dielectric-constant film formed on the surface of the semiconductor wafer W. The treatment temperature T2, which is a highest temperature (peak temperature) at which the front surface of the semiconductor wafer W reaches through the irradiation with flash light, is 600° C. to 1200° C. inclusive, and is 1000° C. in the present preferred embodiment.

When the flash lamps FL end the irradiation with flash light, the temperature of the front surface of the semiconductor wafer W rapidly falls from the treatment temperature T2. The halogen lamps HL are turned off after a predetermined time has elapsed since the flash heating treatment ended, and accordingly, the temperature of the semiconductor wafer W falls from the preheating temperature T1. After the heating treatment of the semiconductor wafer W ends, only nitrogen gas is supplied from the treatment-gas supplying source 85 to replace the inside of the chamber 6 with a nitrogen gas atmosphere.

The falling temperature of the semiconductor wafer W is measured by the radiation thermometer 120, and a result of the measurement is notified to the control unit 3. In this case, it is preferable to remove the filter 22c and use the conversion table 26 for a case in which none of the filters 22a, 22b, and 22c is installed (in other words, the conversion table 26 for the measurement wavelength band of 6 μm to 20 μm). The control unit 3 monitors whether the temperature of the semiconductor wafer W has fallen to a predetermined temperature based on the result of the measurement with the radiation thermometer 120. Then, once the temperature of the semiconductor wafer W has fallen below the predetermined temperature, the pair of the transfer arms 11 of the transfer mechanism 10 is again horizontally moved from the retracted position to the transfer operation position and moved up, and accordingly, the lift pins 12 protrude out of the upper surface of the susceptor 74 to receive the thermally treated semiconductor wafer W from the susceptor 74. Subsequently, the conveyance opening 66, which has been closed by the gate valve 185, is opened, and the semiconductor wafer W placed on the lift pins 12 is conveyed out by the conveyance robot outside the apparatus (step S9), which completes the heating treatment of the semiconductor wafer W at the thermal treatment apparatus 1.

In the present preferred embodiment, since the atmosphere of ammonia, which absorbs infrared light, is formed in the chamber 6, the filter 22c that selectively transmits infrared light having a wavelength not overlapping with the absorption wavelength band of ammonia is installed between the optical lens system 21 and the detector 23 to avoid influence of the infrared light absorption by ammonia. The control unit 3 selects the conversion table 26 corresponding to the filter 22c from the plurality of conversion tables 26 and uses the selected conversion table 26 at the calculation unit 24 of the radiation thermometer 120. In this manner, the radiation thermometer 120 can accurately measure the temperature of the semiconductor wafer W in the ammonia atmosphere, and as a result, the outputs of the halogen lamps HL can be appropriately controlled at the preheating.

Although the preferred embodiment of the present invention is described above, the present invention is applicable to various kinds of modifications made on the above-described preferred embodiment without departing from the scope of the present invention. For example, although the atmosphere of ammonia is formed in the chamber 6 in the above-described preferred embodiment, the technology according to the present invention is applicable to a case with an atmosphere formed of any other treatment gas that absorbs infrared light in a wavelength band at least partially overlapping the measurement wavelength band (6 μm to 20 μm) of the radiation thermometer 120. For example, the technology according to the present invention is applicable to a case in which an atmosphere of nitrous oxide, hydrogen sulfide, or nitric oxide is formed in the chamber 6. When these kinds of treatment gas are used, the filter 22 that selectively transmits infrared light in a wavelength band not overlapping the absorption wavelength band of each treatment gas but partially overlapping the measurement wavelength band of the radiation thermometer 120 is selected and installed between the optical lens system 21 and the detector 23. The conversion table 26 is produced for the filter 22 corresponding to each treatment gas and stored in the storage unit 25 in advance. Then, when an atmosphere of each treatment gas is formed in the chamber 6 and the filter 22 corresponding to the treatment gas is installed between the optical lens system 21 and the detector 23, the control unit 3 selects the conversion table 26 corresponding to the filter 22 from the plurality of conversion tables 26 and uses the selected conversion table 26 at the calculation unit 24 of the radiation thermometer 120. Accordingly, as in the above-described preferred embodiment, the radiation thermometer 120 can accurately measure the temperature of the semiconductor wafer W in an atmosphere of treatment gas that absorbs infrared light.

In the above-described preferred embodiment, the filter 22c that selectively transmits infrared light having a wavelength not overlapping with the absorption wavelength band of ammonia is provided. However, the temperature of the semiconductor wafer W can be accurately measured without the filter 22 when the technology according to the present invention is applied. Specifically, when the conversion table 26 is produced by using a blackbody furnace, the level of the output signal from the detector 23 is recorded for different set temperatures of the blackbody furnace in an ammonia atmosphere with an ammonia concentration (in the above-described preferred embodiment, 3.5 vol. %) same as that at the thermal treatment of the semiconductor wafer W. In this manner, the conversion table 26 with taken into account the absorption of infrared light by ammonia is produced, and thus the temperature of the semiconductor wafer W can be accurately measured in the ammonia atmosphere when the filter 22 is not installed between the optical lens system 21 and the detector 23.

Thus, irrespective of whether the filter 22 is provided, the conversion table 26 to be used by the radiation thermometer 120 may be selected from the plurality of conversion tables 26 in accordance with an atmosphere of treatment gas formed in the chamber 6. In this manner, the temperature of the semiconductor wafer W can be accurately measured in an atmosphere of treatment gas that absorbs infrared light.

In the above-described preferred embodiment, the flash heating unit 5 includes 30 flash lamps FL, but the present invention is not limited thereto. An optional number of the flash lamps FL may be provided. The flash lamps FL are not limited to xenon flash lamps, but may be krypton flash lamps. The number of the halogen lamps HL included in the halogen heating unit 4 is not limited to 40, but may be any optional number.

In the above-described preferred embodiment, the technology according to the present invention is applied to temperature measurement in the preheating at the thermal treatment apparatus 1 configured to irradiate the semiconductor wafer W with flash light from the flash lamps FL after the preheating with the halogen lamps HL. However, the technology according to the present invention is applicable to any apparatus configured to heat the semiconductor wafer W only with halogen lamps (for example, a spike annealing apparatus or a CVD apparatus), and is also applicable to a laser annealing apparatus.

While the invention has been shown and described in detail, the foregoing description is in all aspects illustrative and not restrictive. It is therefore understood that numerous modifications and variations can be devised without departing from the scope of the invention.

What is claimed is:

1. A thermal treatment apparatus configured to heat a substrate by irradiating the substrate with light, the thermal treatment apparatus comprising:
   a chamber that houses the substrate;
   a light irradiation unit configured to irradiate said substrate housed in said chamber with light;

a gas supplying unit configured to supply predetermined treatment gas to said chamber to form an atmosphere of the treatment gas around said substrate;

a radiation thermometer configured to measure temperature of said substrate by receiving infrared light emitted from said substrate;

a storage unit storing a plurality of conversion tables representing a correlation between energy of the infrared light incident on said radiation thermometer and temperature of a black body; and a control unit configured to select a conversion table to be used by said radiation thermometer from said plurality of conversion tables in accordance with the atmosphere of the treatment gas formed in said chamber by said gas supplying unit.

2. The thermal treatment apparatus according to claim 1, further comprising a plurality of filters having different transmission wavelength bands, wherein said control unit is configured to select a filter to be used by said radiation thermometer from said plurality of filters in accordance with the atmosphere of the treatment gas formed in said chamber by said gas supplying unit.

\* \* \* \* \*